(12) United States Patent
Kraehmer et al.

(10) Patent No.: US 8,456,616 B2
(45) Date of Patent: Jun. 4, 2013

(54) OPTICAL SYSTEM FOR MICROLITHOGRAPHY

(75) Inventors: Daniel Kraehmer, Essingen (DE); Wilhelm Ulrich, Aalen (DE); Matthias Manger, Aalen-Unterkochen (DE); Bernhard Gellrich, Aalen (DE)

(73) Assignee: Carl Zeiss SMT GmbH, Oberkochen (DE)

( * ) Notice: Subject to any disclaimer, the term of this patent is extended or adjusted under 35 U.S.C. 154(b) by 338 days.

(21) Appl. No.: 12/993,540

(22) PCT Filed: Apr. 7, 2009

(86) PCT No.: PCT/EP2009/002544
§ 371 (c)(1),
(2), (4) Date: Nov. 19, 2010

(87) PCT Pub. No.: WO2009/141033
PCT Pub. Date: Nov. 26, 2009

(65) Prior Publication Data
US 2011/0069295 A1    Mar. 24, 2011

Related U.S. Application Data

(60) Provisional application No. 61/054,870, filed on May 21, 2008.

(30) Foreign Application Priority Data

May 21, 2008 (DE) .......................... 10 2008 001 892

(51) Int. Cl.
*G02B 3/02* (2006.01)
*G02B 7/02* (2006.01)
*G03B 27/32* (2006.01)
*G03B 27/42* (2006.01)
*G03B 27/54* (2006.01)

(52) U.S. Cl.
USPC .................. 355/67; 355/53; 355/77; 359/708; 359/814; 359/822

(58) Field of Classification Search
USPC .................. 250/492.2; 355/52–53, 55, 67, 77; 359/648–649, 708–712, 717, 811–814, 819, 359/822–823; 430/30
See application file for complete search history.

(56) References Cited

U.S. PATENT DOCUMENTS 3,507,565 A * 4/1970 Alvarez et al. ................. 351/222
6,104,472 A * 8/2000 Suzuki ............................ 355/53

(Continued)

FOREIGN PATENT DOCUMENTS

DE    10 2005 009 624 A1    8/2006
EP     0 187 177 A1          3/1980

(Continued)

OTHER PUBLICATIONS

English translation of German Office Action corresponding to DE Appl No. 10 2008 001 892.9, dated Jan. 21, 2009.

(Continued)

*Primary Examiner* — Hung Henry Nguyen
*Assistant Examiner* — Colin Kreutzer
(74) *Attorney, Agent, or Firm* — Fish & Richardson P.C.

(57) ABSTRACT

An optical system, in particular a projection objective, for microlithography, has an optical axis and at least one optical correction arrangement, which has a first optical correction element and at least one second optical correction element, wherein the first correction element is provided with a first aspherical surface contour, and wherein the second correction element is provided with a second aspherical surface contour, wherein the first surface contour and the second surface contour add up at least approximately to zero, wherein the correction arrangement has at least one drive for movement of at least one of the two correction elements. In this case, at least one of the two correction elements can rotate about a rotation axis which is at least approximately parallel to the optical axis, and the at least one drive is a rotary drive for rotation of one or both of the correction elements about the rotation axis.

20 Claims, 5 Drawing Sheets

U.S. PATENT DOCUMENTS

| | | | |
|---|---|---|---|
| 6,172,740 B1 | 1/2001 | Suzuki | |
| 2002/0054282 A1* | 5/2002 | Sasaya et al. | 355/53 |
| 2007/0195307 A1* | 8/2007 | Schuster et al. | 355/77 |
| 2008/0024874 A1* | 1/2008 | Uitterdijk et al. | 359/649 |
| 2009/0009742 A1* | 1/2009 | Arai | 355/55 |
| 2009/0115989 A1* | 5/2009 | Tanaka | 355/71 |

FOREIGN PATENT DOCUMENTS

| | | |
|---|---|---|
| EP | 0 660 169 | 6/1995 |
| EP | 0 851 304 | 1/1998 |
| EP | 1 349 201 | 10/2003 |
| EP | 1 881 373 | 1/2008 |
| JP | 10-142555 | 5/1998 |

OTHER PUBLICATIONS

International Search Report for corresponding PCT Application No. PCT/EP2009/002544, filed Apr. 7, 2009.

* cited by examiner

OPTICAL SYSTEM FOR MICROLITHOGRAPHY

FIELD

The invention relates to an optical system, in particular a projection objective, for micro-lithography, having an optical axis and having at least one optical correction arrangement, which has a first optical correction element and at least one second optical correction element, wherein the first correction element is provided with a first aspherical surface contour, and wherein the second correction element is provided with a second aspherical surface contour, wherein the first surface contour and the second surface contour add up at least approximately to zero, wherein the correction arrangement has at least one drive for movement of at least one of the two correction elements.

BACKGROUND

An optical system of the type mentioned above is known from EP 0 851 304 A.

Without any restriction of the generality, the optical system mentioned above will be described for a projection objective for microlithography, but without the present invention being restricted to this.

A projection objective is a part of a projection exposure installation that is used to produce semiconductor components. For this purpose, a pattern which is arranged on an object plane of the projection objective and is referred to as a reticle is imaged by means of the projection objective onto a photosensitive layer on a substrate, which is referred to as a wafer.

As a result of the continuous progress in miniaturization of the structures of the semiconductor components to be produced, the imaging characteristics of projection objectives are subject to increasingly more stringent requirements.

There is therefore always an aim to reduce imaging errors of projection objectives for microlithography to a very low level. While production-dependent imaging errors in the case of a projection objective can already be corrected after the production of the projection objective by reworking, for example by making individual lenses or mirrors of the projection objective aspherical, it is more difficult to correct imaging errors which occur during operation.

During operation, the imaging light which is used is partially absorbed by the optical elements of the projection objective, which leads to heating of the optical elements of the projection objective. The heating induces imaging errors which can assume complicated field profiles, particularly when, as is the case in modern projection exposure installations, the beam path through the projection objective is not rotationally symmetrical with respect to the optical axis, and, in particular, only a subarea of individual optical elements is used by the beam path. Furthermore, specific types of illumination (also referred to as illumination settings) are increasingly being used in modern projection exposure installations, in particular dipole or quadrupole illuminations. These multipole illuminations lead in particular to higher-order imaging errors, and/or imaging errors in higher Zernike orders.

The document EP 0 851 304 A, which has been cited above, describes an optical system in the form of a projection, objective for microlithography, which has an optical correction arrangement in order to compensate for heat-induced imaging errors which occur during operation. A first exemplary embodiment of the optical correction arrangement has two optical correction elements, which both each have an aspherical surface contour on their mutually facing surfaces, wherein the two aspherical surface contours of the two correction elements add up to at least approximately zero. A correction arrangement such as this is also referred to as an Alvarez manipulator.

In an initial position (null position) of the two correction elements, the optical effects of the aspherical surface contours of the two correction elements cancel, one another out. In this known correction arrangement, the two correction elements can be moved with respect to the optical axis, translationally, transversely relative to one another. The translational movement of the correction elements relative to one another shifts the aspherical surface contours of the two correction elements with respect to one another, thus achieving a resultant optical effect on the wavefront passing through the two correction elements. This optical effect is then used for correction of an imaging error, wherein the aspherical surface contours are for this purpose matched to the imaging error to be compensated for.

The same document also describes an Alvarez manipulator which is formed from a total of three correction elements, wherein the first correction element together with the second correction element forms a first correction element pair, and the second correction element together with the third correction element forms a second correction element pair.

The document JP 10-142555 A discloses a projection objective for microlithography which has an optical correction arrangement for correction of distortion. The correction arrangement has at least two optical correction elements, whose mutually opposite surfaces have contours which are complementary to one another. The two correction elements are shifted relative to one another in the direction of the optical axis, in order to correct distortion.

While carrying out a lithographical production method for production of semiconductor components, it is sometimes necessary to rotate the illumination setting around the optical axis in order to allow both horizontally aligned and vertically aligned structures to be manufactured, with an optimum illumination setting. Furthermore, in some cases, it is also necessary to use the projection objective to image structures which are arranged in arbitrary angular orientations. The variation of the illumination setting once again results in new imaging errors, which cannot be compensated for sufficiently quickly in known optical systems. In other words, the known optical systems are not suitable for reacting sufficiently quickly to different illumination settings and, in fact, these optical systems require the removal of the optical correction arrangement, and the installation of a correction arrangement which is appropriately matched to the new illumination setting.

The document EP 0 660 169 A describes a projection exposure installation in which an optical correction arrangement is provided for correction of non-rotationally symmetrical imaging errors. The optical correction arrangement in this known optical system has two cylindrical lenses, one of which has a negative refractive power, while the other has a positive refractive power. When the two cylindrical lenses are arranged such that their cylinder axes run parallel to one another, the two cylindrical lenses together produce no optical effect, provided that the absolute values of the refractive powers are of equal magnitude. If the two cylindrical lenses are rotated relative to one another such that their cylindrical axes are at right angles to one another, this maximizes their optical, in this case astigmatic, effect. However, the use of cylindrical lenses as correction elements restricts the flexibility and the number of imaging errors which can be corrected and, in particular, allows only low-order imaging errors to be corrected.

SUMMARY

The invention is therefore based on the object of developing an optical system of the type mentioned initially such that the number of correction degrees of freedom is increased by an optical correction arrangement whose design has little complexity.

According to the invention, this object is achieved with respect to the optical system mentioned initially in that at least one of the two correction elements can be rotated about a rotation axis which is at least approximately parallel to the optical axis, and in that the at least one drive is a rotary drive for rotation of one or both of the correction elements about the rotation axis.

The optical correction arrangement in the optical system according to the invention is furthermore based on the fundamental concept of the Alvarez manipulator. However, in contrast to the known Alvarez manipulators, the invention provides that at least one of the at least two correction elements can rotate about a rotation axis which runs parallel to the optical axis, which means that the rotation axis may coincide with the optical axis, or else that the rotation axis may be different from the optical axis.

The provision of the capability for at least one, and preferably both, of the correction elements of the optical correction arrangement to rotate also results in a number of advantages. The capability of at least one of the optical correction elements to rotate can on the one hand replace the translational movement, which is provided in the known Alvarez manipulators, for shifting the aspherical surface contours of the correction elements relative to one another, in order to set a specific correction effect. Alternatively or in addition to this, however, the capability of the correction elements to rotate can be used to rotate the entire optical correction arrangement about the rotation axis, not with the aim of changing the optical correction effect of the optical correction arrangement, but in order to realign the entire optical correction arrangement with respect to the illumination setting, for example if the illumination setting is rotated.

In this way, and in contrast to the optical systems known from the prior art, the optical system according to the invention is considerably more flexible in terms of correction of imaging errors, without increasing the design complexity.

With regard to the last-mentioned aspect of the optical system according to the invention, one preferred refinement provides that both correction elements can rotate about the rotation axis jointly, without any relative rotation with respect to one another.

In this refinement, the first and the second correction elements form a correction element pair in the form of an Alvarez manipulator which can therefore rotate as an entity about the rotation axis, in order to make it possible to react to rotation of the illumination setting. For example, if the illumination setting is rotated through 90°, the optical correction arrangement is also rotated through 90°, and the desired optical correction effect can then be achieved in this new basic position, which has been changed through 90°, by moving the positions of the two correction elements relative to one another, by a relative movement of the two correction elements with respect to one another.

In one refinement, the design relating to which is simple, the first and the second correction elements are or can preferably be coupled to one another such that they rotate together, and the one rotary drive rotates both correction elements jointly.

In this refinement, only one rotary drive is required for both correction elements, thus advantageously keeping the design complexity very simple, because only one rotating bearing is required for both correction elements, and only one rotary drive.

In the abovementioned refinement, it is also preferable if the first correction element, can be moved translationally, transversely with respect to or parallel to the optical axis relative to the second correction element, and the first correction element has an associated translational drive, wherein the arrangement comprising the two correction elements and the translational drive can rotate about the rotation axis.

In this particularly simple refinement, the optical correction arrangement is partially in the form of a traditional Alvarez manipulator, but in contrast to the known Alvarez manipulator, the correction arrangement in the present case is mounted such that it can rotate as an entity about the rotation axis or optical axis.

In a further refinement of the invention, as an alternative to this, the optical correction effect of the at least two optical correction elements is not achieved by a translational relative movement transversely with respect to or parallel to the optical axis, but by the at least one rotary drive rotating the first correction element relative to the second correction element, wherein the first and the second correction elements have an associated further rotary drive for joint rotation of the first and second correction elements, without any relative rotation with respect to one another.

Therefore, in this refinement variant, on the one hand, the optical correction effect is adjusted by rotating the two correction elements relative to one another, and the entire correction arrangement can be rotated as an entity, in order to align the correction arrangement with a rotated illumination setting while, in principle, it is sufficient to provide only one of the two correction elements with a rotary drive in order to achieve the relative rotation of the first correction element with respect to the second correction element, it is preferable, in order to increase the degrees of freedom of the correction options in the optical system, if the second correction element can likewise rotate about the rotation axis relative to the first correction element, and if the second correction element has an associated second rotary drive for rotation of the second correction element independently of the first correction element.

The correction effect of the two correction elements is better if the two of them are rotated in opposite senses. If only one of the two correction elements is rotated, undesirable aberration components are induced in the optical effect of the two correction elements, at least when the rotation angles are relatively large, as a result of which the correction effect is not optimal.

The optical correction arrangement of the optical system according to the invention may, in the simplest case, have only two correction elements.

However, it is more preferable in order to increase the correction degrees of freedom, for the optical correction element to have at least three correction elements, wherein the second correction element is arranged between the first correction element and a third correction element, wherein the first and the second correction elements form a first correction element pair, and the second and the third correction elements form a second correction element pair.

In this way, three correction elements form two correction element pairs, which are also referred to in the following text as Alvarez pairs.

In a case such as this, it is furthermore preferable if the third correction element can rotate about the rotation axis at least jointly with the second correction element, without any relative rotation with respect to one another.

As described above with reference to the first and second correction elements, the third correction element can be moved translationally, transversely with respect to or parallel to the optical axis, wherein the third correction element then has an associated translational drive, wherein the arrangement comprising the third and the second correction elements and the translational drive can rotate about the rotation axis. It is particularly preferable if all three correction elements can rotate about the rotation axis without any relative rotation with respect to one another.

This refinement is particularly advantageous in conjunction with the refinement mentioned above, according to which the first correction element can also be moved translationally, transversely with respect to or parallel to the optical axis, relative to the second correction element.

In this refinement, two Alvarez pairs are therefore formed, in which the optical correction effect is adjusted by a translational movement of the relevant correction elements transversely with respect to or parallel to the optical axis, wherein, however, both pairs can rotate jointly about the rotation axis, in order to allow the entire arrangement to be set to a rotated illumination setting.

As an alternative to the refinement, of the correction arrangement with correction elements which can be moved translationally, transversely with respect to or parallel to the optical axis, the third correction element may have the capability to rotate about the rotation axis relative to the first correction element and/or the second correction element, wherein the third correction element has an associated rotary drive for rotation of the third correction element independently of the first correction element and/or second correction element.

In the case of the refinement of the correction arrangement having at least three optical correction elements, it is sufficient for only two outer correction elements (first and third correction elements) each to have a rotary drive, in order that the first correction element and the third correction element can be rotated, preferably independently of one another, relative to the central (second) correction element, in order to achieve the desired optical correction effect. However, in order to increase the correction degrees of freedom, all the correction elements can be provided with their own rotary drive, thus allowing all the correction elements to be rotated individually, independently of the others.

In the case of the refinement of the optical correction arrangement having at least three optical correction elements, it is also preferable if the aspherical surface contours of the first correction element pair add up to zero, and the aspherical surface contours of the second correction element pair add up to zero, and differ from the aspherical surface contours of the first correction element pair.

In this case, it is advantageous that different imaging errors can be corrected by the two correction element pairs.

In this context, it is also preferable if the aspherical surface contours of the first correction element pair are matched to one order of aberration, and the aspherical surface contours of the second correction element pair are matched to the next-higher order of the same aberration.

In this refinement, the two correction element pairs can correct the same imaging error type as such, but in different Zernike orders. In this case, different Zernike orders mean, in particular, different orders in the r (radius) coordinate. It is self-evident that in the situation in which an imaging error in the fundamental order is, for example, proportional to $r^2$, the next-higher order may be proportional to $r^4$. For example, the first correction element pair can thus correct astigmatism in the lowest order (Z5), while the second correction element pair can correct the next-higher order (Z12) of the astigmatism. Further examples are the order Z7 and the next-higher order Z14 of the coma imaging error, and the order Z10 and the next-higher order Z19 of the trefoil error.

In a further preferred refinement, the distance between the first and the second correction elements and, possibly, the distance between the second and the third correction elements is less than 1 mm, preferably less than 0.2 mm, with respect to the null position.

The drives mentioned above for rotation or for translational movement of the individual correction elements preferably comprise one or more sensors for detection of the position of the moved correction element and for monitoring/operating the respective rotary or translational drive.

In the situation in which individual correction elements of the optical correction arrangement are moved translationally, a translational bearing is provided, which is preferably monolithic, in which case the translational bearing can preferably be formed from roller bearings, gas bearings or magnetic bearings.

In this case, a translational drive may preferably have pneumatic drive elements, preferably bellows, piezo actuating elements, electric-motor actuating elements or the like.

For the rotating bearing of the individual correction elements or of the entire optical correction arrangement, this may preferably have monolithic kinematics. In this case, it is particularly advantageous for the rotating bearing to be in the form of a magnetic bearing, which uses the diamagnetic effect, with a multiplicity of differently oriented permanent magnets.

The rotary drive or drives can preferably have piezo actuating elements or electric-motor actuating elements. An embodiment of a rotary drive for the present optical system which is formed from an electrostatically operating drive element is particularly advantageous.

Trailing mechanisms or mechanisms for readjustment of the electrical lines are preferably provided for the electrical lines which are required for the drive.

Further advantages and features will be become evident from the following description and the attached drawing.

It is self-evident that the features mentioned above and those which are still to be explained in the following text can be used not only in the respectively stated combination but also in other combinations or on their own without departing from the scope of the present invention.

BRIEF DESCRIPTION OF THE DRAWINGS

Exemplary embodiments of the invention are illustrated in the drawing, and will be described in more detail in the following text with reference to the drawing, in which.

DETAILED DESCRIPTION

Figure 1:
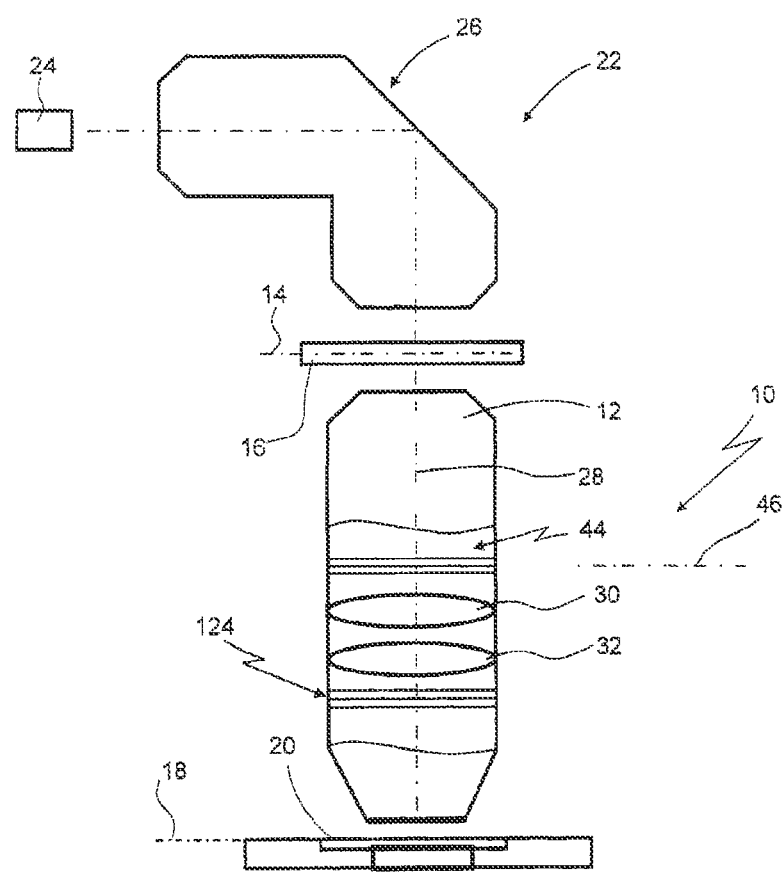
FIG. 1 shows a schematic illustration of an optical system using the example of a projection objective of a projection exposure installation for microlithography.

FIG. 1 shows an optical system, provided with the general reference sign 10, in the form of a projection objective 12, which is used to produce microstructured components in microlithography. The projection objective 12 is used to image a reticle 16, which is arranged on an object plane 14 and has a pattern, onto a substrate 20 (wafer) which is arranged on an image plane 15. The projection objective 12 is part of a projection exposure installation 22 which, in addition to the projection objective 12, contains a light source 24, normally a laser, and an illumination system 25.

The following description of the optical system 10 in the form of the projection objective 12 is based on the projection objective 12 having only one optical axis 28, in order to simplify the description, and without restriction of the generality.

The projection objective 12 has a plurality of optical elements, of which FIG. 1 shows, by way of example, two optical components 30 and 32 in the form of lenses. However, it is self-evident that the projection objective 12 has or may have further optical elements, in the form of lenses and/or mirrors, in addition to the two optical elements 30 and 32.

The projection objective 12 is subject to the requirement that the pattern of the reticle 16 is imaged onto the substrate 20 as far as possible without any imaging errors. Even if, from the manufacturing point of view, the projection objective 12 can be produced such that it has no immanent imaging errors before initial operation, imaging errors can occur during operation of the projection objective 12, resulting in a deterioration in the structural accuracy of the imaging of the pattern of the reticle 18 onto the substrate 20. One reason for such imaging errors occurring during operation is, in particular, heating of the individual optical elements 30, 32, which can lead to changes in the surface geometry of these elements, to a change in the material characteristics, in particular the refractive indices of these elements, etc. In particular, such imaging errors caused by heating may occur without being rotationally symmetrical with respect to the optical axis 28, if the illumination of the projection objective 12 by means of the illumination system 26 is not rotationally symmetrical. For example, in the case of dipole or quadrupole illumination, in which the imaging light which passes through the projection objective 12 is split into a plurality of individual, mutually separated, beams, or if light passes through the projection objective 12 off-axis, as is the case in particular with catadioptric projection objectives, which are formed from lenses and mirrors, heating may cause imaging errors which are not rotationally symmetrical.

Figure 2:
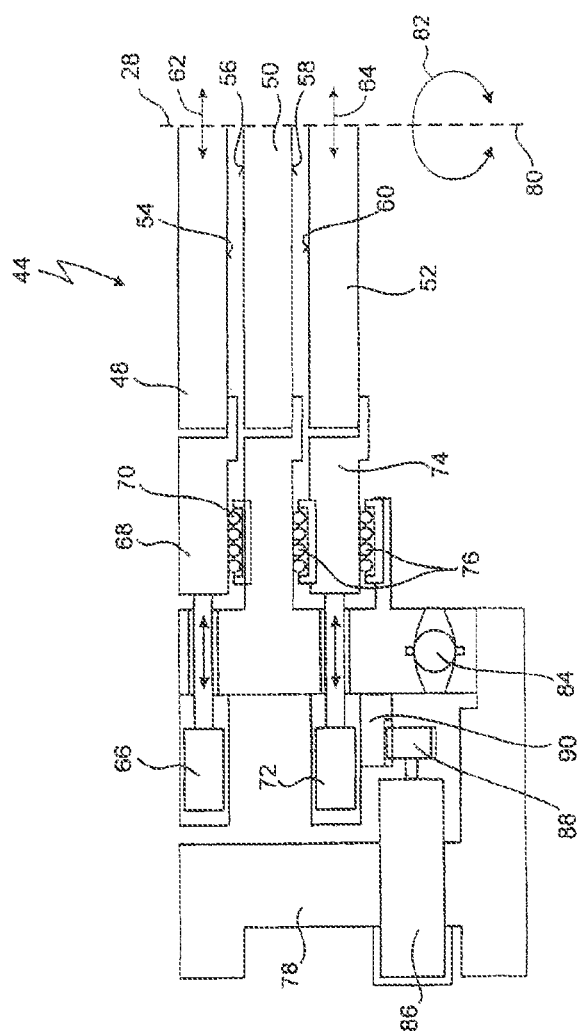
FIG. 2 shows a first exemplary embodiment of an optical correction arrangement of the optical system shown in FIG. 1.
Figure 6:
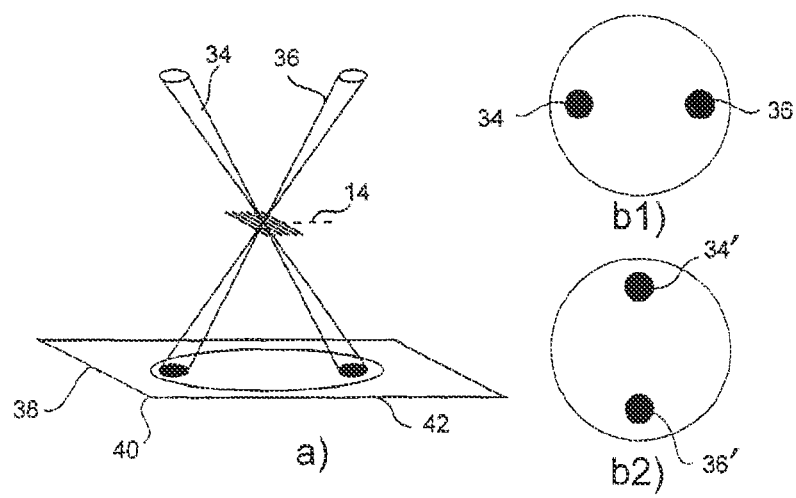
FIG. 6 shows the beam path for dipole illumination.

FIG. 6a) schematically illustrates a dipole illumination setting. Two illumination beams 34 and 36 are incident, on the reticle 16 (not illustrated) on the object plane 14 from the illumination system of the projection exposure installation, FIG. 6a) also shows a sketch of an optical component 38 of the projection objective 12 shown in FIG. 1, illustrating how the two illumination beams 34 and 36 strike the optical component 38 of the projection objective 12 at points 40 and 42. FIG. 6b1) shows the intensity load on a pupil plane of the projection objective 12, in the form of a plan view. FIG. 6b2) shows the intensity load for a dipole illumination setting, for which the two light beams 34' and 36' have been rotated through 90° about the optical axis 28 with respect to the dipole illumination setting in FIG. 6b1) for the illumination beams 34 and 36. By way of example, the illumination setting is rotated through 90° in order to image horizontal and vertical structures of the reticle 16. Dipole illumination settings rotated through different angles may also be required, on the basis of FIG. 6b1) and FIG. 6b2), in order to image structures with undefined angular orientations.

The different illumination settings result in the imaging errors as mentioned above, caused by heating being correspondingly different. In order to make it possible to react dynamically to such imaging errors in a short time during operation, the projection objective 12 has at least one correction arrangement 44.

The correction arrangement 44 is preferably arranged in a pupil plane 46 of the projection objective 12.

Various refinements of the correction arrangement 44 will be described in more detail in the following text with reference to FIGS. 2 to 5.

FIG. 2 shows a first exemplary embodiment of the correction arrangement 44.

The correction arrangement 44 illustrated in FIG. 2 has a total of three correction elements 48, 50 and 52. In this case, the correction element 48 and the correction element 50 form a first correction element pair, while the correction element 50 and the correction element 52 form a second correction element pair.

Mutually facing surfaces 54 and 56 of the correction elements 48 and 50 each have aspherical surface contours which add up at least approximately to zero, that is to say the aspherical surface contour of the surface 54 is complementary to the aspherical surface contour of the surface 56.

In the same way, the correction element 50 has a second surface 58, which faces a surface 60 of the correction element 52, wherein the surfaces 58 and 50 likewise have mutually complementary aspherical surface contours, which therefore at least approximately add up to zero.

The surface 54 of the correction element 48 is separated from the surface 56 of the correction element 50 by less than 1 mm, preferably less than 0.2 mm.

The surface 58 of the correction element 50 is likewise separated from the surface 60 of the correction element 52 by less than 1 mm, preferably less than 0.2 mm.

Figure 5:
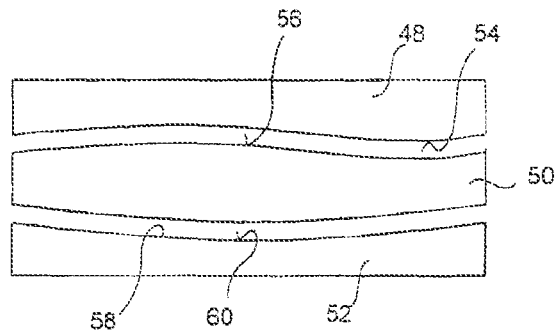
FIG. 5 shows three correction elements of the optical correction arrangements shown in FIGS. 2 to 4, on their own.

FIG. 5 shows the three correction elements 48, 50 and 52 on their own, in which case FIG. 5 shows, by way of example, and with an exaggerated amplitude, aspherical surface contours for the surfaces 54, 56, 58 and 60.

The first correction element pair, which is formed from the correction elements 48 and 50, forms a first Alvarez pair, and the second correction element pair, which is formed from the correction elements 50 and 52, forms a second Alvarez pair.

Except for their aspherical surface contours, the correction elements 48, 50 and 52 are preferably in the form of plane-parallel plates. If the correction elements 48, 50 and 52 are arranged as illustrated in FIG. 5, with the mutually facing surfaces 54, 56 and 58, 60 touching or virtually touching, the correction arrangement 44 overall is in the form of a plane-parallel, plate and has no optical correction effect since, in this null position, the effects of the aspherical surface contours compensate for one another.

In the exemplary embodiment shown in FIG. 2, the correction element 48 and/or the correction element 52 can now be moved translationally, as indicated by the double-headed arrows 62 and 64, transversely with respect to the optical axis 28, relative to the central correction element 50. Such relative movement of the correction element 48 and/or of the correction element 52 relative to the central correction element 50 results in the aspherical surface contours on the surfaces 54 and 56 and/or the surface contours on the surfaces 58 and 60 being shifted with respect to one another, thus making it possible to achieve a desired resultant optical correction effect when light passes through the correction arrangement 44.

The desired correction effect depends on the specific selected aspherical surface contour of the surfaces 54, 56 and 58, 60.

The aspherical surface contours on the surfaces 54 and 56 are preferably chosen to be different from the aspherical surface contours on the surfaces 58 and 60, as a result of which the first correction element pair can be used to set a different optical correction effect than can be achieved with the second correction element pair. The aspherical surface contours on the surfaces 54 and 56 are preferably matched to a specific order of aberration, and the aspherical surface contours on the surfaces 58 and 60 are then preferably matched to the next-higher order of the same aberration.

In one practical example, the aspherical surface contours on the surfaces 54 and 56 are designed to correct wavefront aberration in the Zernike order Z5 as the lowest order of astigmatism, but the aspherical surface contours on the surfaces 58 and 60 are then matched to the next-higher order Z12 of astigmatism. Further examples are the orders Z7 and Z14 of a coma imaging error, and the orders Z10 and Z19 for the trefoil error. This basic principle can, of course, be applied to further imaging errors. In this case, it is self-evident, that, in each case, it is possible to correct not only the fundamental order and the next-highest order of an imaging error in this way, but also further, even higher orders of the imaging errors.

The aspherical surface contours on the surfaces 54 and 56 and on the surfaces 58 and 60 preferably represent the antiderivative or the integral of the function of the imaging error to be corrected, since the optical effect of the surface contours is proportional to the gradient of the surface contours.

The correction element 48 has an associated translational drive 66 in order to allow the correction element 48 to be moved in a corresponding manner to the double-headed arrow 62. The translational drive 66 may have pneumatic drive elements, preferably bellows, piezo actuating elements or electric-motor actuating elements which, in particular, are able to precisely set the very small movement, distances which are required to set the optical correction effect.

The correction element 48 is held on a holder 68, which is mounted on a translational bearing 70 such that it can move translationally. By way of example, the bearing 70 may be in the form of a roller bearing, although a gas bearing or magnetic bearing may also be used for the bearing 70.

In a comparable manner, the correction element 52 has an associated translational drive 72, a holder 74 and a translational bearing 76.

The optical correction arrangement 44 furthermore has a supporting structure 78, which supports the correction elements 48, 50 and 52 as well as the drives 66, 72.

The entire arrangement comprising the correction elements 48, 50, 52, the holders 68, 74, the bearings 70, 76 and the drives 66, 72 can rotate, as indicated by a double-headed arrow 82, around a rotation axis 80 which runs parallel to the optical axis 28 and, in the illustrated exemplary embodiment, coincides with the optical axis 28. The capability to rotate the entire correction arrangement 44 (with the exception of the supporting structure 78) allows the optical correction arrangement 44 to be matched to different illumination settings, for example to the two dipole illumination settings which are rotated through 90° with respect to one another, as shown in FIGS. 6b1) and 6b2). However, it is also possible to select any other desired rotation positions of the correction arrangement 44 about the rotation axis 80.

For this purpose, the correction arrangement 44 has a rotating bearing 84 which, for example and preferably, is in the form of a magnetic bearing with a multiplicity of differently oriented permanent magnets, and which uses the diamagnetic effect.

In order to rotate the correction elements 48, 50 and 52 about the rotation axis 80 jointly and without any relative rotation with respect to one another, a rotary drive 86 is also provided, as well as the rotating bearing 84, and, for example, has a drive wheel 88 which engages with a plate 90, which is connected to the correction elements 48, 50 and 52 such that they rotate together.

The rotary drive 86 may, in the simplest case, be an electric motor, in which case rotary drives other than electric motors may also be considered, for example piezo actuating drives and the like.

In the exemplary embodiment shown in FIG. 2, the correction elements 48, 50 and 52 are therefore always rotated jointly about the rotation axis 80, without any relative rotation with respect to one another, in order to match the correction arrangement 44 to different illumination settings, while the correction element 48 is moved translationally relative to the correction element 50, and/or the correction element 52 is moved translationally relative to the correction element 50, in order to set a specific optical correction effect.

Figure 3:
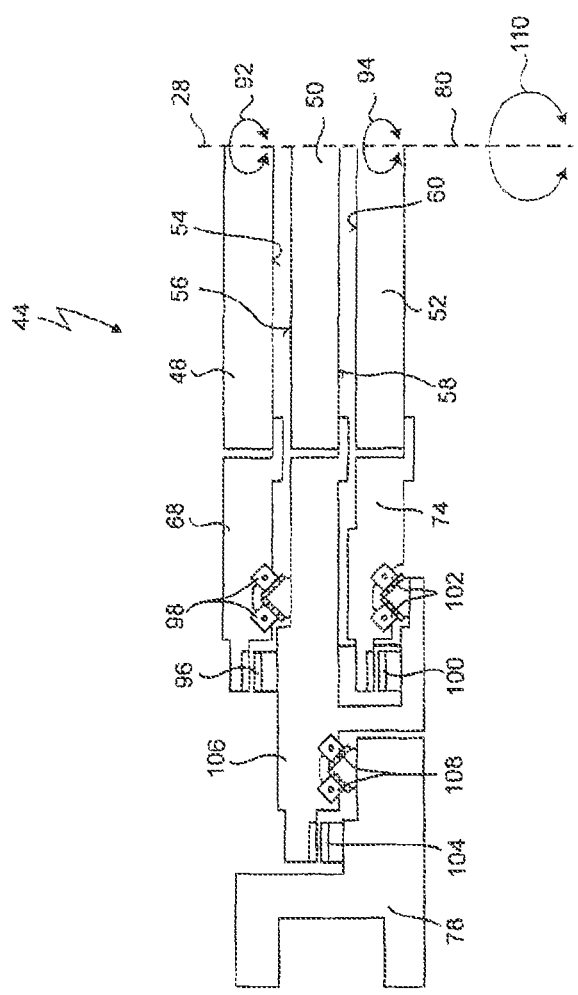
FIG. 3 shows a further exemplary embodiment of an optical correction arrangement for use in the optical system shown in FIG. 1.

FIG. 3 shows a further exemplary embodiment of the correction arrangement 44, in which parts of the correction arrangement 44 which correspond to parts of the correction arrangement 44 in FIG. 2 are provided with the same reference signs.

The correction arrangement 44 as shown in FIG. 3 once again has the three correction elements 48, 50 and 52, in which case the adjacent correction elements 48 and 50, and 50 and 52, respectively, each form one correction element pair. The aspherical surface contours which are provided on the surfaces 54 and 56 in this case add up at least approximately to zero, and the aspherical surface contours on the surfaces 58 and 80 likewise add up at least approximately to zero.

In contrast to the exemplary embodiment in FIG. 2, the correction elements 48 and 52 cannot move translationally, transversely with respect to the optical axis 28, but the correction element 48 can rotate relative to the correction element 50 about the rotation axis 80, which once again coincides with the optical axis 28, as is indicated by an arrow 92, to be precise in both rotation directions about the rotation axis 80. The correction element 52 can rotate about the rotation axis 30 relative to the correction element 50, as indicated by an arrow 94. In contrast, the correction element 50 can rotate only together with the correction elements 48 and 52, as will be described in the following text.

In this exemplary embodiment, the desired optical correction effect for each correction element pair 48, 50 and 50, 52 is achieved by a rotating relative movement rather than by a translational relative movement.

This will be explained in the following text for the correction element pair comprising the correction elements 48 and 50, using an example which relates to the correction of the fundamental order of the astigmatism (Z5).

The Zernike polynomial Z5, in polar coordinates, is as follows $$Z5(r,\phi) = r^2 \cos(2\phi),$$

In order to obtain a correction effect in the Zernike order Z5, the aspherical surface contours on the surfaces 54 and 56 must be chosen, as already mentioned above, to be proportional to the integral or to an antiderivative of the function $Z5(r,\phi)$, that is to say proportional to $Z6(r,\phi)$. The function $Z6(r,\phi)$ is as follows:

$$Z6(r,\phi)=r^2\sin(2\phi).$$

If only the correction element 48 is now rotated through an angle $\Delta\phi$ around the optical axis 28 relative to the correction element 50, this results in an optical effect which is proportional to:

$$Z6(r,\phi+\Delta\phi)-Z6(r,\phi)=\sin(2\Delta\phi)\cdot Z5(r,\phi)-2\sin^2(\Delta\phi)\cdot z6(r,\phi).$$

As can be seen from the above equation, the desired Z5 effect is proportional to the rotation angle for small rotation angles $\Delta\phi$, while the rotation also creates a parasitic Z6 effect, which increases with the square of the rotation angle $\Delta\phi$. The absolute value of the relative amplitude of Z6 with respect to Z5 is:

$$2\sin^2(\Delta\phi)/\sin(2\Delta\phi)=\tan(\Delta\phi).$$

If the rotation angles Lip are kept sufficiently small, the parasitic undesirable Z6 effect components are small. For example, if the parasitic optical effect in Z6 is intended to be at most 1% of the desired correction effect in Z5, then the rotation angle must be less than 0.57°.

In order to allow the rotary movements of the correction element 48 relative to the correction element 50, the correction element 48 has an associated rotary drive 96 and an associated rotating bearing 98, with the latter bearing the holder 68 such that it can rotate, and with the correction element 48 being firmly connected to said holder 68.

In a corresponding manner, the correction element 52 has an associated rotary drive 100 and an associated rotating bearing 102, via which the holder 74 of the correction element 52 is borne such that it can rotate about the rotation axis 80. The rotary drives 96 and 100 allow the correction elements 48 and 52 to rotate independently of one another relative to the central correction element 50.

Furthermore, the correction arrangement 44 has the characteristic that the entire arrangement comprising the correction elements 48, 50 and 52, including the rotary drives 96 and 100, can be rotated jointly about the rotation axis 80, without relative rotation of the correction elements 48, 50 and 52 with respect to one another, in a similar manner to that in the case of the correction arrangement 44 in FIG. 2.

For this purpose, a further rotary drive 104 is arranged on the supporting structure 78, and the correction element 50 is attached to a holder 106, with the holder 106 being borne on the supporting structure 78 by a rotating bearing 108, such that it can rotate. When the rotary drive 104 is operated, the holder 106 is rotated about the rotation axis 80, and in the process drives the arrangement comprising the correction elements 48, 50 and 52, including the rotary drives 96 and 100 of the correction elements 48 and 52, as is indicated by an arrow 110.

Figure 4:
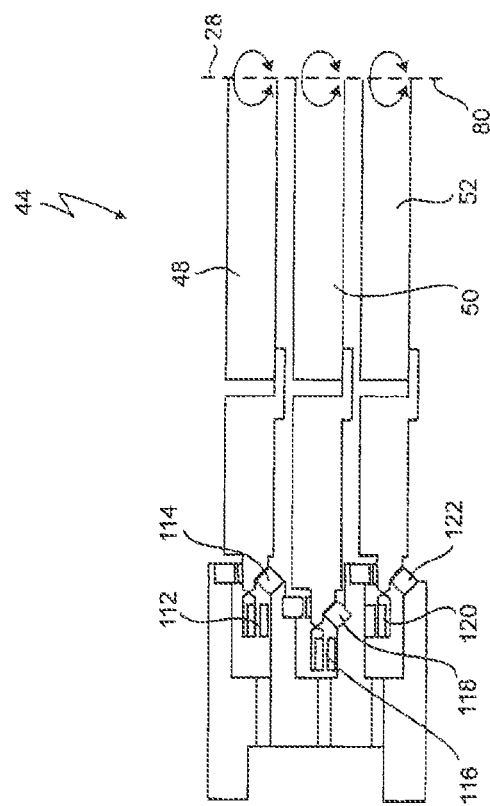
FIG. 4 shows yet another exemplary embodiment of an optical correction arrangement for use in the optical system shown in FIG. 1.

While, in the case of the exemplary embodiment in FIG. 3, only in each case one of the correction elements of the correction element pair, to be precise only the correction element 48 of the correction element pair 48 and 50, and only the correction element 52 of the correction element pair 50, 52, can rotate about the rotation axis 80, while the correction element 50 does not have its own rotary drive for relative rotation with respect to the correction element 48 or with respect to the correction element 52, FIG. 4 illustrates yet another exemplary embodiment of the correction arrangement 44, in which all three correction elements 48, 50 and 52 can rotate individually and relative to one another.

In this case, the correction element 48 has an associated rotary drive 112 and an associated rotating bearing 114, the correction element 50 has an associated rotary drive 116 and an associated rotating bearing 118, and the correction element 52 has an associated rotary drive 120 and an associated rotating bearing 122.

In this refinement, all the correction elements 48, 50 and 52 can be rotated about the rotation axis 80, or the optical axis 28, individually and relative to one another, or else jointly, without any relative rotation with respect to one another. In addition, a joint rotary drive; like the rotary drive 104 in FIG. 3, can be provided for joint rotation of all three correction elements 48, 50 and 52, without relative rotation with respect to one another, or all the rotary drives 112, 116 and 120 are operated uniformly at the same time, in order to jointly rotate all the correction elements 48, 50 and 52.

In addition to the exemplary embodiments described above, one or more of the correction elements 48, 50 and 52 may have an associated sensor for detection of the position of the individual correction elements 48, 50, 52 relative to the overall system and relative to one another.

Furthermore, the Positions of the correction elements 48, 50 and 52 in the direction of the optical axis 28 can also be monitored by adjustment elements, which are not illustrated, in which case, for example, the adjustment elements may be spacing disks or spacers, ground to size.

As shown in FIG. 1, a plurality of optical correction elements can also be provided in the optical system 10, for example the correction arrangement 44 and a further correction arrangement 124, which is designed according to one of the exemplary embodiments described above.

The invention claimed is:

1. An optical system having an optical axis, the optical system comprising:
   an optical correction arrangement, comprising:
      a first optical correction element having a first aspherical surface contour;
      a second optical correction element having a second aspherical surface contour and a third aspherical surface contour;
      a third optical correction element having a fourth aspherical contour; and
      a rotary drive configured to rotate at least one element about a rotation axis which is at least approximately parallel to the optical axis of the optical system, the at least one element being selected from the group consisting of the first optical correction element, the second optical correction element and the third optical correction element,
   wherein:
      the second optical correction element is between the first and third optical correction elements;
      the first and second surface contours are complementary;
      the third and fourth surface contours are complementary;
      the first and second optical correction elements form a first correction element pair;
      the second and third optical correction elements form a second correction element pair;
      the aspherical surface contours of the first correction element pair differ from the aspherical surface contours of the second correction element pair;

the aspherical surface contours of the first correction element pair are matched to an order of aberration;

the aspherical surface contours of the second correction element pair are matched to a higher order of the same aberration; and the optical system is a microlithography projection objective.

2. The optical system of claim 1, wherein the first and second optical correction elements are configured to rotate about the rotation axis jointly, without any relative rotation with respect to one another.

3. The optical system of claim 2, wherein the first and the second optical correction elements are capable of being coupled to each other so that they rotate together, and the rotary drive is configured to rotate the first and second optical correction elements jointly.

4. The optical system of claim 2, wherein the first and the second optical correction elements are coupled to each other so that they rotate together, and the rotary drive is configured to rotate the first and second optical correction elements jointly.

5. The optical system of claim 2, wherein:
the optical correction arrangement further comprises a translational drive configured to translate the first optical correction element in a first direction relative to the second optical correction element;
the first direction is transverse to the optical axis or the first direction is parallel to the optical axis; and
the optical correction arrangement is configured to rotate about the rotation axis.

6. The optical system of claim 2, wherein the rotary drive is configured to rotate the first optical correction element relative to the second correction element, and the optical correction arrangement comprises a second rotary drive configured to jointly rotate the first and second optical correction elements, without any relative rotation with respect to one another.

7. The optical system of claim 1, wherein the second optical correction element is configured to rotate about the rotation axis relative to the first optical correction element, and the optical correction arrangement further comprises a second rotary drive configured to rotate the second correction element independently of the first optical correction element.

8. The optical system of claim 1, wherein the rotation axis lies on the optical axis.

9. The optical system of claim 1, wherein the third optical correction element is configured to rotate about the rotation axis at least jointly with the second correction element, without any relative rotation with respect to one another.

10. The optical system of claim 1, wherein:
the optical correction arrangement further comprises a translational drive configured to translate the third optical correction element in a first direction relative to the second optical correction element;
the first direction is transverse to the optical axis or the first direction is parallel to the optical axis relative to the second optical correction element; and
the optical correction arrangement is configured to rotate about the rotation axis.

11. The optical system of claim 1, wherein the third optical correction element is configured to rotate about the rotation axis relative to the first optical correction element and/or the optical second correction element, and the optical correction arrangement further comprises a second rotary drive configured to rotate the third optical correction element independently of the first optical correction element and/or the second optical correction element.

12. The optical system of claim 1, wherein the aspherical surface contours of the first correction element pair are matched to an order of astigmatism, and the aspherical surface contours of the second correction element pair are matched to a higher order of astigmatism.

13. The optical system of claim 1, wherein the aspherical surface contours of the first correction element pair are matched to an order of a coma imaging error, and the aspherical surface contours of the second correction element pair are matched to a higher order of the coma imaging error.

14. The optical system of claim 1, wherein the aspherical surface contours of the first correction element pair are matched to an order of a trefoil error, and the aspherical surface contours of the second correction element pair are matched to a higher order of the trefoil error.

15. The optical system of claim 1, wherein a distance between the first and second optical correction elements is less than 1 mm.

16. A system, comprising:
an illumination system; and
a projection objective, comprising:
an optical correction arrangement, comprising:
a first optical correction element having a first aspherical surface contour;
a second optical correction element having a second aspherical surface contour and a third aspherical surface contour;
a third optical correction element having a fourth aspherical surface contour; and
a rotary drive configured to rotate at least one element about a rotation axis which is at least approximately parallel to the optical axis of the optical system, the at least one element being selected from the group consisting of the first optical correction element, the second optical correction element and the third optical correction element,
wherein:
the second optical correction element is between the first and third optical correction elements;
the first and second surface contours are complementary;
the third and fourth surface contours are complementary;
the first and second optical correction elements form a first correction element pair;
the second and third optical correction elements form a second correction element pair;
the aspherical surface contours of the first correction element pair differ from the aspherical surface contours of the second correction element pair;
the aspherical surface contours of the first correction element pair are matched to an order of aberration;
the aspherical surface contours of the second correction element pair are matched to a higher order of the same aberration; and
the system is a microlithography projection exposure installation.

17. The system of claim 16, wherein the aspherical surface contours of the first correction element pair are matched to an order of astigmatism, and the aspherical surface contours of the second correction element pair are matched to a higher order of astigmatism.

18. The system of claim 16, wherein the aspherical surface contours of the first correction element pair are matched to an order of a coma imaging error, and the aspherical surface contours of the second correction element pair are matched to a higher order of the coma imaging error.

19. The system of claim 16, wherein the aspherical surface contours of the first correction element pair are matched to an order of a trefoil error, and the aspherical surface contours of the second correction element pair are matched to a higher order of the trefoil error.

20. The system of claim 16, wherein the rotation axis lies on the optical axis.

* * * * *

UNITED STATES PATENT AND TRADEMARK OFFICE
CERTIFICATE OF CORRECTION

| | |
|---|---|
| PATENT NO. | : 8,456,616 B2 |
| APPLICATION NO. | : 12/993540 |
| DATED | : June 4, 2013 |
| INVENTOR(S) | : Daniel Kraehmer |

It is certified that error appears in the above-identified patent and that said Letters Patent is hereby corrected as shown below:

In the Specification

Column 7, Line 16, delete "plane 15." insert --plane 18.--;

Column 7, Line 19, delete "system 25." insert --system 26.--;

Column 7, Line 39, delete "18" insert --16--;

Column 9, Line 45, delete "movement, distances" insert --movement distances--.

Signed and Sealed this
Eighth Day of October, 2013

Teresa Stanek Rea
*Deputy Director of the United States Patent and Trademark Office*